(12) United States Patent
Chen et al.

(10) Patent No.: US 12,266,278 B2
(45) Date of Patent: Apr. 1, 2025

(54) DISPLAY SCREEN BASED ON LED DISPLAY PANELS

(71) Applicant: ZHEJIANG WGO PHOTOELECTRIC TECHNOLOGY CO., LTD., Huzhou (CN)

(72) Inventors: Xincai Chen, Huzhou (CN); Haiyan Wu, Huzhou (CN); Jiehua Lang, Huzhou (CN); Peiliang Wang, Huzhou (CN); Zhiduan Cai, Huzhou (CN); Jingyun Xu, Huzhou (CN); Qingxiang Ma, Huzhou (CN); Yong Li, Huzhou (CN)

(73) Assignee: ZHEJIANG WGO PHOTOELECTRIC TECHNOLOGY CO., LTD., Huzhou (CN)

( * ) Notice: Subject to any disclaimer, the term of this patent is extended or adjusted under 35 U.S.C. 154(b) by 303 days.

(21) Appl. No.: 17/965,270

(22) Filed: Oct. 13, 2022

(65) Prior Publication Data
US 2023/0377491 A1    Nov. 23, 2023

(30) Foreign Application Priority Data
May 18, 2022   (CN) .......................... 202210537317.3

(51) Int. Cl.
| G09F 9/00 | (2006.01) |
| G09F 9/302 | (2006.01) |
| G09F 9/33 | (2006.01) |
| H05K 7/20 | (2006.01) |

(52) U.S. Cl.
CPC .............. G09F 9/3026 (2013.01); G09F 9/33 (2013.01); H05K 7/20954 (2013.01)

(58) Field of Classification Search
CPC ...... G09F 9/3026; G09F 9/33; H05K 7/20954
See application file for complete search history.

(56) References Cited

U.S. PATENT DOCUMENTS

| 9,564,070 | B2 * | 2/2017 | Nall ....................... F21V 23/005 |
| 2005/0248935 | A1 * | 11/2005 | Strip ....................... H05B 45/60 |
| | | | 362/145 |
| 2008/0297072 | A1 * | 12/2008 | Snijder ................. F21V 21/005 |
| | | | 315/312 |

(Continued)

Primary Examiner — Gerald J Sufleta, II
(74) Attorney, Agent, or Firm — Olive Law Group, PLLC

(57) ABSTRACT

The present disclosure provides a display screen based on LED display panels. The display screen includes a plurality of the LED display panels, at least one installation columns, a plurality of longitudinal reference parts, a plurality of assembling and installation assemblies, and a plurality of power control boxes; several LED display panels arranged in longitudinal direction consist of one group; each group of LED display panels has been longitudinally assembled through longitudinal reference parts arranged close to two sides, of backs of a plurality of LED display panels; two transverse adjacent groups of LED display panels are arranged at two sides of one installation column which is vertically located; The transverse reference part of each assembling and installation assembly and the two adjacent longitudinal reference parts are clasped on back to back sides of the installation columns. The display screen has the advantages of being thin, flexible to use.

10 Claims, 11 Drawing Sheets

(56) References Cited

U.S. PATENT DOCUMENTS

| | | | |
|---|---|---|---|
| 2009/0147504 A1* | 6/2009 | Teeters | F21V 33/006 362/153 |
| 2010/0165627 A1* | 7/2010 | Wung | F21V 7/0083 362/249.02 |
| 2011/0283632 A1* | 11/2011 | Sutton | A47B 46/005 52/36.1 |
| 2015/0167948 A1* | 6/2015 | Wasserman | F21S 8/03 362/249.01 |
| 2015/0301781 A1* | 10/2015 | Ekkaia | F21S 8/03 362/237 |
| 2017/0033154 A1* | 2/2017 | Lan | H01L 33/62 |

\* cited by examiner

DISPLAY SCREEN BASED ON LED DISPLAY PANELS

CROSS REFERENCE TO RELATED APPLICATION

This application claims priority to and the benefit of Chinese Patent Application No. CN2022105373173, dated May 18, 2022, the entire disclosure of which is incorporated herein by reference in its entirety.

TECHNICAL FIELD

The present disclosure relates to the technical field of LED display screens, in particular to a display screen based on LED display panels.

BACKGROUND ART

LED display screens are active controlled electroluminescence equipment with LEDs as basic luminous bodies, and can display information such as characters, graphs and images through control processing units of systems. LED display screens have the advantages of low power consumption, low costs, high brightness, large field of view, long visual range, waterproofness, various specifications and varieties and the like due to the adoption of low-voltage scanning drive. This can meet the requirements of various application scenes, have very broad development prospects, and are widely regarded as LED application markets with the most growth potential and the highest development speed.

Existing large indoor and outdoor LED display screens, such as an LED display screen cabinet and an LED display screen disclosed by Chinese utility model patent with the patent number: ZL201420685738.1, wherein the LED display screen includes the LED display screen cabinet and display modules installed on the LED display screen cabinet. For another example, Chinese utility model patent with the patent number: ZL201921475480.1 discloses a display screen cabinet, an LED display screen and an LED display screen assembling structure, wherein the LED display screen includes LED modules, a power box and the display screen cabinet.

As mentioned above, as each of the existing LED display screens is formed by assembling a plurality of display units and cabinets are used as carriers for the display units, in order to meet the requirements of the cabinets for structural strength, it is inevitable that the LED display screen is thick and heavy. Thus, the existing LED display screens have the following defects: 1, the existing LED display screens are inconvenient to transport, carry, install and maintain as they are thick and heavy; 2, as minimum assembling units are cabinets, the sizes of the whole display screens can only be adjusted according to the quantity of the cabinets, and the sizes of the display screens cannot be flexibly adjusted as each cabinet includes a plurality of modules; and the sizes of the cabinets are hardly changed as they are generally unified in industries; 3, higher costs, whether they are a production cost, a transportation cost, or an installation and maintenance cost, are increased due to the fact that the existing LED display screens are heavy and thick; and 4, the existing LED display screens are cumbersome in appearance and poor in attractiveness.

SUMMARY

The present disclosure aims at providing a display screen based on LED display panels in order to solve the problems in the prior art described above, a large screen is formed by adopting ultrathin LED display panels as minimum assembling units, and the display screen has the advantages of being thin, flexible to use, convenient to install and maintain, lower in costs, attractive in appearance and the like.

The objectives of the present disclosure are achieved by the following technical solutions:

A display screen based on LED display panels, includes a plurality of the LED display panels, at least one installation columns, a plurality of longitudinal reference parts, a plurality of assembling and installation assemblies, and a plurality of power control boxes; several LED display panels arranged in longitudinal direction consist of one group of LED display panels; each group of LED display panels has been longitudinally assembled through longitudinal reference parts arranged at positions, close to two sides, of backs of the plurality of LED display panels; two transverse adjacent groups of LED display panels are arranged at two sides of one installation column which is vertically located;

each LED display panel includes a panel body, a display assembly arranged on the panel body, and a plug-in panel arranged on a back of the panel body; and a power control box is jointly arranged on backs of the same group of LED display panels; and each assembling and installation assembly includes a transverse reference part, and a tensioning part respectively connected with two ends of the transverse reference part and the two adjacent longitudinal reference parts, and the transverse reference part and the two adjacent longitudinal reference parts are clasped on back to back sides of the installation column.

As a preference of the present disclosure, each panel body includes an installation board and a heat insulating board spaced from the installation board, and supporting ribs connected with the installation board and the heat insulating board, a heat insulating flow guide chamber is formed between the installation board and the heat insulating board, and flow guide cooling holes are formed in opposite side faces of the panel body.

As a preference of the present disclosure, each panel body further includes two end boards, and sealing parts arranged at the other two ends of the panel body, wherein the two end boards, the installation board and the heat insulating board are integrally formed; and the flow guide cooling holes are formed in the sealing parts.

As a preference of the present disclosure, a limiting groove is formed in the surface of the installation board, and a fixing part is arranged in the limiting groove.

As a preference of the present disclosure, each of four side ends of each panel body is provided with a slope structure with a front face wider than a rear face, and an assembling plane is arranged at one end, close to the front side, of the slope structure.

As a preference of the present disclosure, each display assembly includes a PCB board, and an IC control chip and an LED lamp arranged on two sides of the PCB board respectively, and the IC control chip is tightly attached to surface of the panel body.

As a preference of the present disclosure, signal and power interfaces of the display assembly is formed in the panel body; a waterproof ring is arranged at positions, around the signal and power interfaces, in the panel body, and one end of each waterproof ring extends out of the back of the corresponding panel body and makes tight contact with an inner side face of the corresponding plug-in panel.

As a preference of the present disclosure, a lock groove facing the panel body is formed in a position, in length direction of the longitudinal reference part, of the longitudinal reference part; and the lack groove has a structure with an opening narrower than its inner chamber; a lock is arranged on the panel body, two lock blocks are arranged on back to back sides of ends, extending into the lock groove, of lock cylinders of the lock; a distance between back to back ends of the two lock blocks is larger than a width of the opening of each lock groove; and an operating hole communicated to the lock cylinder is formed in front side face of the LED display panel and the longitudinal reference part.

As a preference of the present disclosure, a locking table is arranged on side faces of the lock cylinder; a locking slope facing one side of each lock block is arranged on the corresponding locking table, and a pushing-abutting part fitting in with the locking slope is arranged on the panel body.

As a preference of the present disclosure, the pushing-abutting part adopts pushing-abutting screws arranged on outer side face of the panel body, and a fixing block fixedly connected with the pushing-abutting screws is arranged on inner side face of the panel body.

The present disclosure has the beneficial effects:
1. the design thought that a traditional LED display screen must adopt a cabinet as a minimum assembling unit is broken through, and a LED display panel is creatively used as a minimum assembling unit, so that large indoor and outdoor LED display screens get into an ultrathin age;
2. the product is more convenient to transport, carry, install and maintain due to its thin structure of the LED display panel;
3. by using a LED display panel as a minimum assembling unit, the assembling requirements of display screens with different specifications can be effectively met, thereby greatly improving use flexibility;
4. due to the omission of cabinet structures, the whole production cost is greatly reduced, and meanwhile, the weight is lower, thereby reducing human and material costs needed during transportation, carrying, installation and maintenance effectively;
5. the whole display screen has revamped its bulky image, and appears to be thin and attractive, thereby greatly improving the market competitiveness of the product;
6. the display screen can be suitable for various indoor and outdoor environments as the LED display panels have thin structures, and meanwhile, have excellent heat dispersion and waterproof properties;
7. the quantity of holes formed in the LED display panel is reduced by designing limiting grooves and plastic strips, thereby improving production and processing efficiency;
8. by designing the plug-in panel adopting signal and power collinear transmission, wiring structures are simplified, and the stability of circuit connection is improved;
9. the whole display screen formed by assembling the LED display panels is simple in structure, convenient to operate and capable of ensuring installation and maintenance efficiency;
10. the surface smoothness of the assembled LED display screen is effectively ensured based on reference properties of the longitudinal reference part, the transverse reference part and the installation column (such as a square steel);
11. the longitudinal reference parts are not only used for longitudinal assembling of a plurality of LED display panels, but also used for fitting in with the transverse reference parts in installing and clasping the display screen and the installation column (such as a square steel), and are also used for installing the power control boxes; and their structures are ingenious in design, thereby greatly reducing the quantity of accessories needed by whole installation, and meanwhile, simplifying installation procedures, improving installation efficiency, and reducing costs;
12. A LED display panel is used as a minimum assembling unit, and one LED display panel can be independently detached and replaced during maintenance, so that maintenance is more convenient;
13. locking operation is smoother due to gradual locking structures formed by the locking slope of the locks and the pushing-abutting screws, so that the locking effect is more stable and reliable; and in-place prompt structure is further designed, thereby enabling installation and maintenance personnel to conveniently grasp locking states while ensuring the stability of locking positions; and
14. installation position of the power control box may be adjusted according to actual conditions, so as to adapt to the specification of the display screen, or be prevented from interfering with the outside.

DETAILED DESCRIPTION OF THE EMBODIMENTS

The present disclosure will be further stated in detail with reference to accompanying drawings and specific embodiments below.

Figure 1:
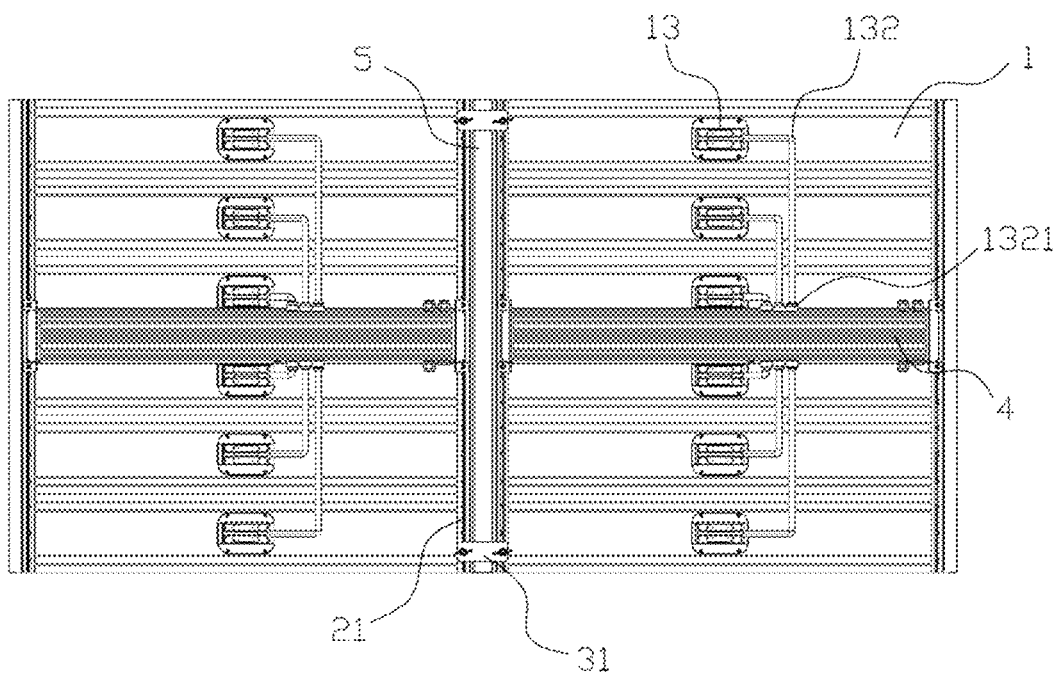
FIG. 1 is a rear view of a display panel based on LED display panels according to the present disclosure.

As shown in FIG. 1, a display screen based on LED display panels is formed by assembling the LED display panels 1 as minimum assembling units. The LED display panel 1 is the foundation and core of the whole display screen, and their structural design is a starting point of the whole disclosure, so that the specific structure of the LED display panel will be firstly introduced below.

Figure 2:
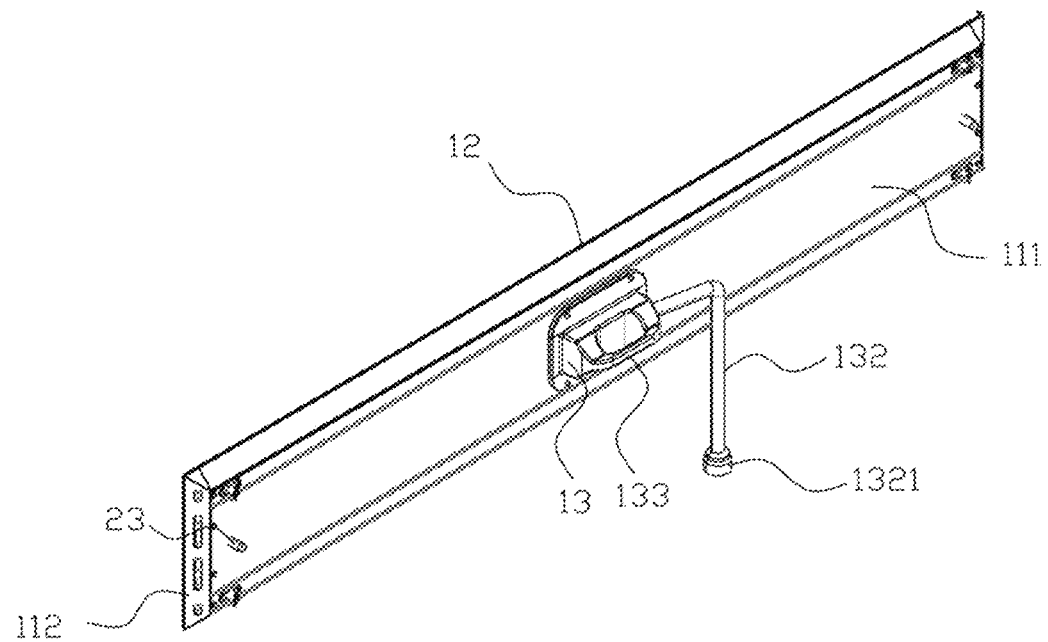
FIG. 2 is a structural schematic diagram of an LED display panel according to the present disclosure.
Figure 3:
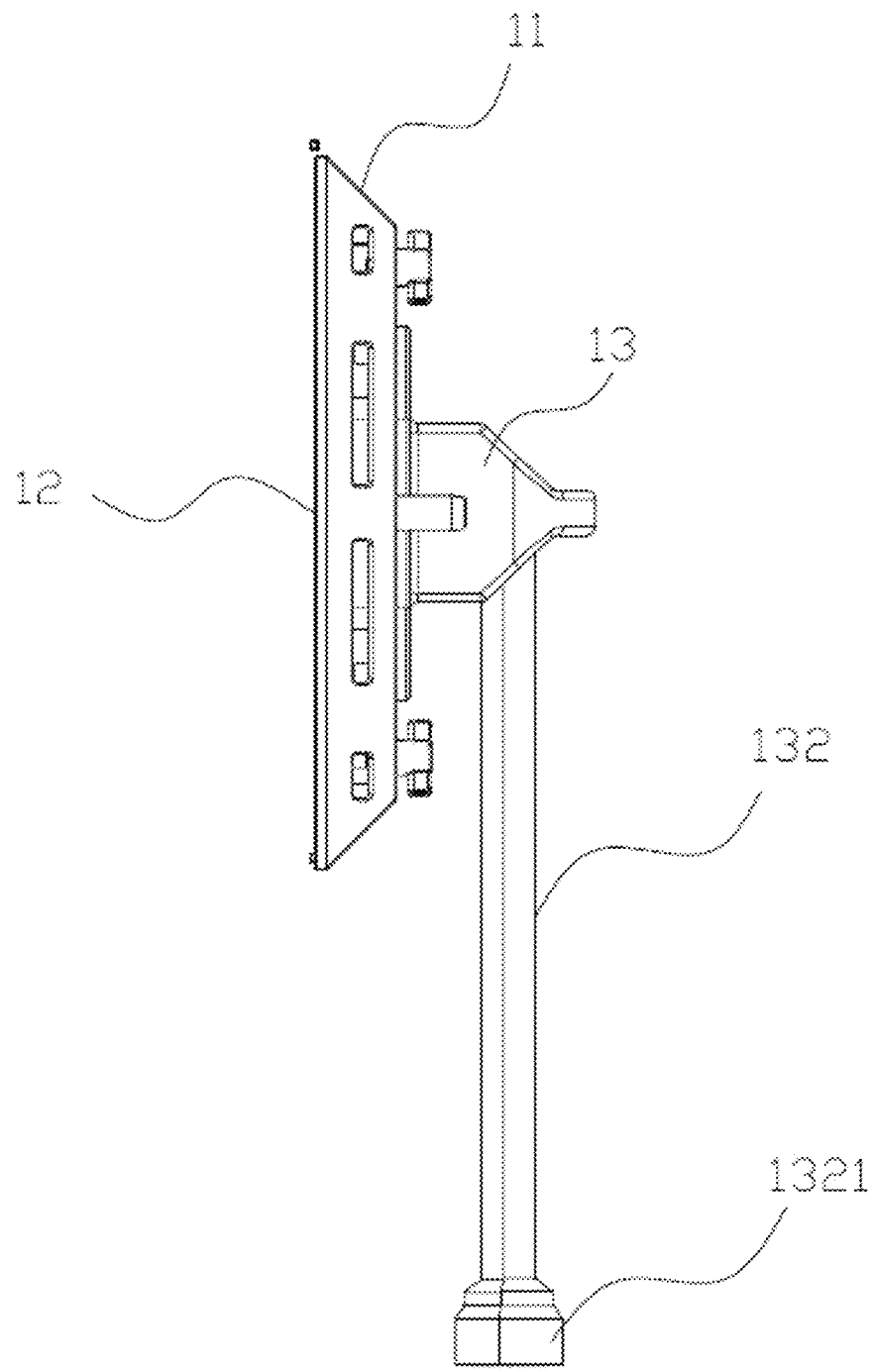
FIG. 3 is a side view of an LED display panel according to the present disclosure.

As shown in FIG. 2 and FIG. 3, each LED display panel 1 mainly consists of a panel body 11, a display assembly 12 and a plug-in panel 13.

Wherein, each panel body 11 includes an integrally-formed aluminum profile plate body 111, and sealing parts 112 inserted into openings of two run-through ends of the aluminum profile plate body 111.

Figure 4:
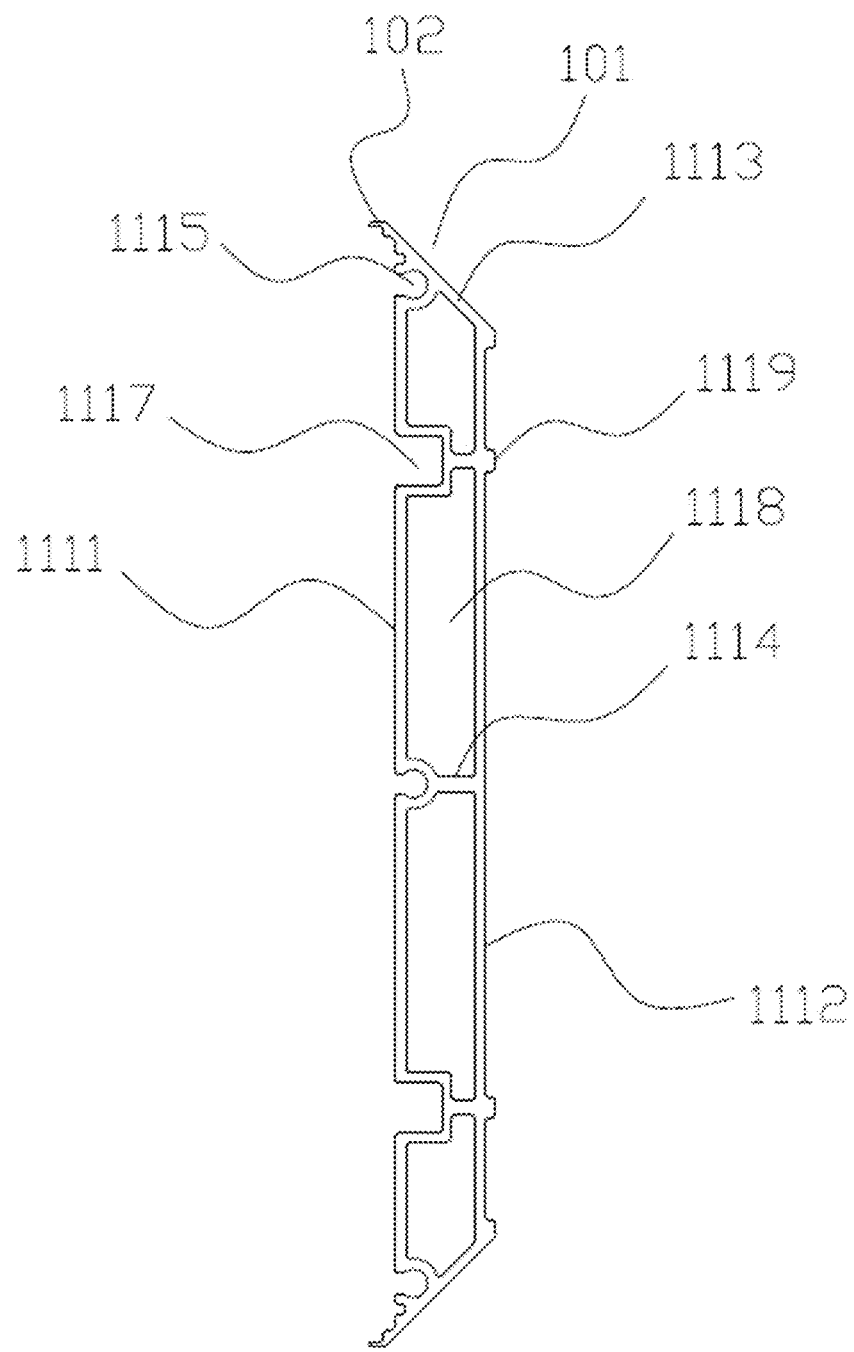
FIG. 4 is a side view of an aluminum profile plate body according to the present disclosure.

As shown in FIG. 4, each aluminum profile plate body 111 further includes an installation board 1111 and a heat insulating board 1112 spaced from the installation board, two end boards 1113 connected with ends of the installation board 1111 and the heat insulating board 1112, and three supporting ribs 1114 connected with interiors of the installation board 1111 and the heat insulating board 1112. Furthermore, two ends and a middle of a surface of each installation board 1111 are respectively provided with a limiting groove 1115, and a fixing part such as a plastic strip is arranged in the limiting groove 1115 and used for fitting in with screws to fix the display assembly 12 onto the installation board 1111, so as to avoid additional punching in the installation board; and as the installation board is thin, it is not stable in case that the screws are fixed directly by punching. Wherein, the limiting groove 1115 is provided with a structure with an opening narrower than its interior, so as to ensure positional stability of the plastic strip in the limiting groove. Avoiding grooves 1117 are formed in two sides of the surface of each installation board 1111 respectively and used for avoiding elements such as capacitors in the display assembly 12, so as to reduce thicknesses of the whole LED display panel as much as possible.

A heat insulating flow guide chamber 1118 is formed between the heat insulating board 1112 and the installation board 1111 due to the arrangement of the heat insulating board; on one hand, the installation board 1111 absorbs heat generated by the display assembly 12, the heat is discharged into the heat insulating flow guide chamber 1118, and then efficient heat dispersion is performed through convection action formed among a plurality of cooling holes formed in opposite side face of the panel body; and on the other hand, when the display screen is used outdoors, the temperature of the heat insulating board 1112 is too high due to direct sunlight, and the heat insulating flow guide chamber 1118 effectively prevents heat on the heat insulating board 1112 from directly acting on the installation board 1111 and the display assembly 12, that is, achieving the efficient heat dispersion by the heat insulating flow guide chamber 1118 under the convection action.

The three supporting ribs 1114 are arranged in the two avoiding grooves 1117 and one limiting groove 1115 in the middle. On one hand, structural strength of the avoiding grooves 1117 and the limiting groove 1115 is directly utilized, and on the other hand, lengths of the supporting ribs 1114 in connection direction of the installation board 1111 and the heat insulating board 1112 are reduced, so as to improve structural strength of the supporting ribs themselves, thereby improving supporting strength between the installation board 1111 and the heat insulating board 1112 and ensuring stability of distances therebetween, to prevent deformation. In addition, four extending ribs 1119 are further arranged on the surface of each heat insulation board 1112, which are extended sections of the two end boards 1113 and extended sections of the supporting ribs 1114 at the two avoiding grooves 1117 respectively, and they are mainly used for improving whole structural strength, and meanwhile, achieve a certain position identification effect for installation personnel during installation.

Figure 5:
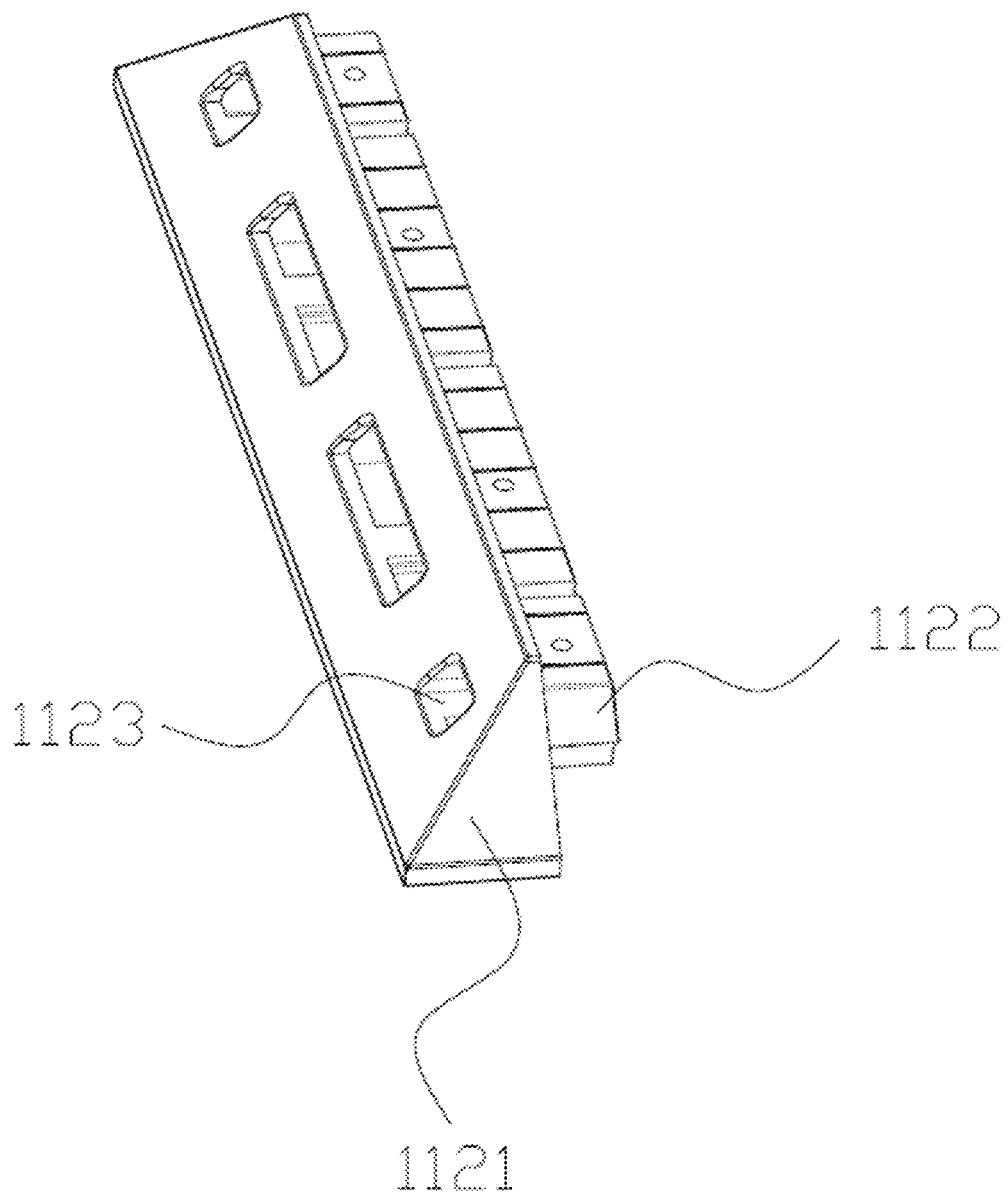
FIG. 5 is a structural schematic diagram of a sealing part according to the present disclosure.

As shown in FIG. 5, the sealing part 112 generally may be made of plastic, mainly plays a role in sealing, and does not take on a supporting effect. Each sealing part specifically includes a cover cap 1121 and pin connectors 1122 adapting to shapes of openings in ends of the corresponding aluminum profile plate body 111. Due to the existence of the three supporting ribs 1114, the aluminum profile plate body 111 is internally divided into four chambers, so there are four corresponding pin connectors 1122, and meanwhile, one flow guide cooling hole 1123 penetrating out of the cover cap 1121 is formed in each pin connector 1122. As the sealing part needs to be independently produced and formed by injection molding, the flow guide cooling holes 1123 may be directly integrally formed in the sealing part 112, later reprocessing is avoided, and cooling holes are prevented from being processed in the aluminum profile plate body 111, thereby improving production efficiency. During actual use, if the LED display panels are horizontally installed, that is, the two sealing parts 112 are located at left and right ends at the same height, that is, the plurality of groups of opposite flow guide cooling holes 1123 are located in the left and the right ends at the same height, at this moment, convection is formed between the cooling holes in the left and right ends under the action of external air flow, and internal air flow penetrates through the whole heat insulating flow guide chambers 1118 to perform effective cooling. If the LED display panels are vertically installed, that is, the two sealing parts 112 are located at upper and lower ends in the same vertical direction, that is, the plurality of groups of opposite flow guide cooling holes 1123 are located in the upper and lower ends in the same vertical direction, at this moment, more efficient air convection can be formed between the upper and lower cooling holes by effectively utilizing a principle that hot air rises, so as to achieve efficient cooling, and this manner is especially suitable for outdoor spaces in hot weather. In addition, in order to improve installation stability of the sealing parts 112, fixing holes are formed in the pin connectors 1122, so as to stably connect the sealing parts 112 and the aluminum profile plate body 111 through screws.

Figure 6:
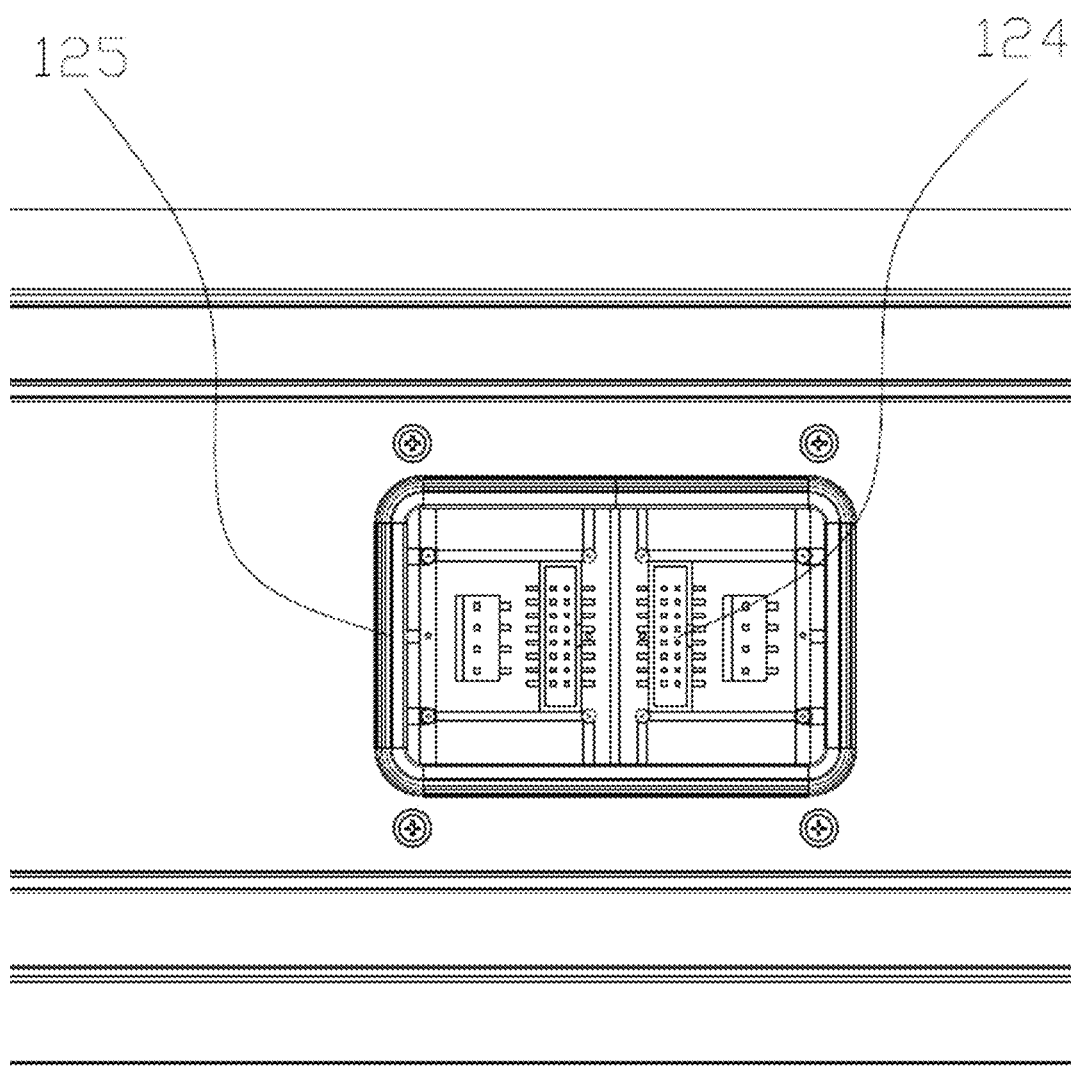
FIG. 6 is a structural schematic diagram of a signal and power interface of an LED display panel according to the present disclosure.
Figure 7:
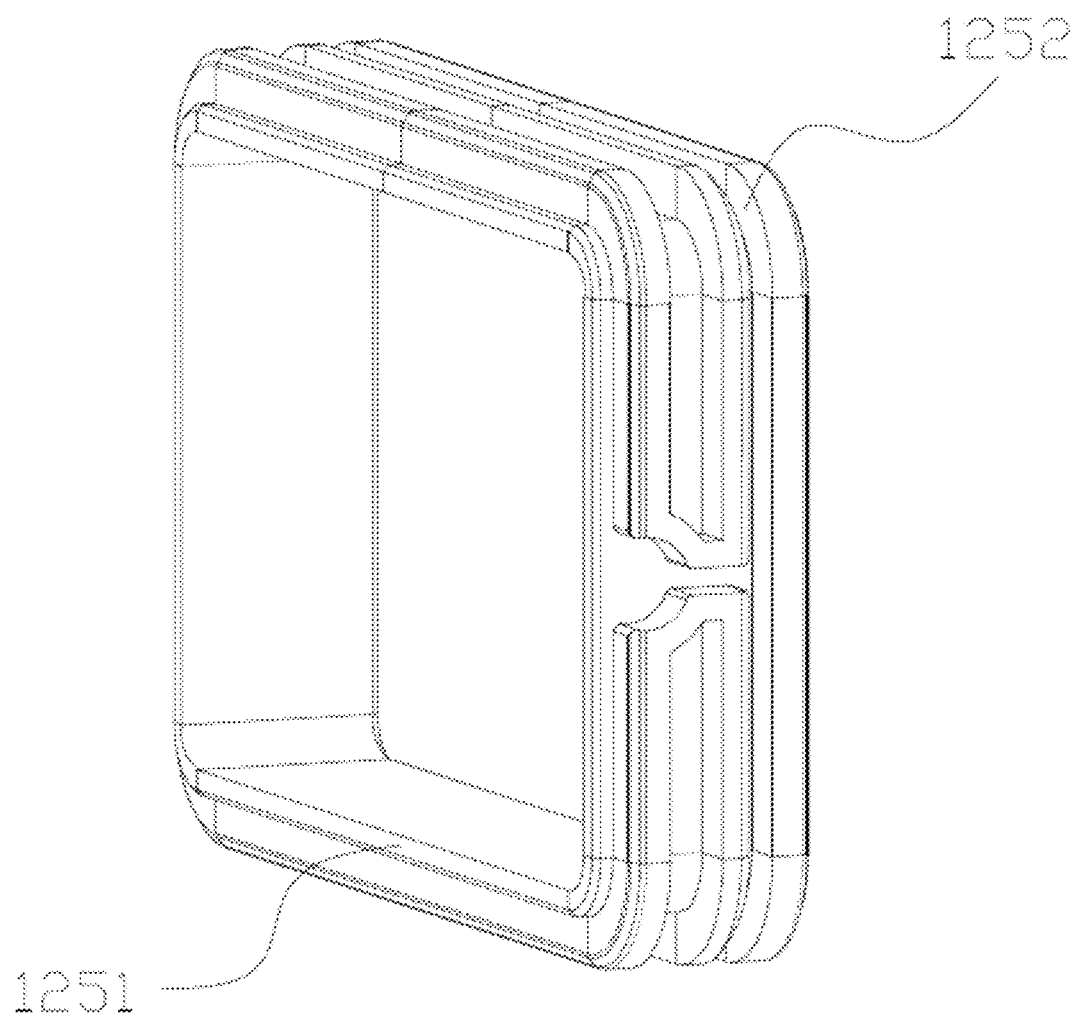
FIG. 7 is a structural schematic diagram of a waterproof ring according to the present disclosure.

Each display assembly 12 includes a PCB board, and an IC control chip and an LED lamp arranged on two back to back sides of the PCB board respectively, wherein the IC control chips are main heat production components of the display assembly, so that they are directly attached to the surfaces of the installation board 1111 to rapidly conduct heat generated by the IC control chips to the installation board 1111 through good heat conductivity of aluminum, and then cooling is performed through the heat insulating flow guide chambers 1118 and the flow guide cooling holes 1123. As shown in FIG. 6, each display assembly 12 further includes a signal and power interface 124; and the signal and power interface 124 is formed in the panel body 11 through an opening in the installation board 1111; and meanwhile, a waterproof ring 125 connected with the installation board 1111 and the heat insulating board 1112 is further arranged on side of the opening, so as to isolate a waterproof chamber in each heat insulating flow guide chamber 1118, thereby meeting waterproof requirements of the signal and power interface 124. Openings are also formed in the heat insulating board 1112 to lead out connecting wires. Specifically, as shown in FIG. 7, a flange 1251 is arranged at one end of each waterproof ring 125 and used for being clamped into the opening in the installation board 1111, so as to ensure waterproofness at this end; and a clamping groove 1252 is formed in a side face of the other end of each waterproof ring, so as to make an edge of the opening in the heat insulating board 1112 clamped into the clamping groove 1252 through elasticity of the waterproof ring itself, thereby achieving installation and fixation of the waterproof ring. Moreover, one end of each waterproof ring 125 extends out of the corresponding heat insulating board 1112 through a clamping structure of the waterproof ring 125 and the heat insulating board 1112 to make tight contact with an inner side face of the corresponding plug-in panel 13, so that water seeping from a position between the plug-in panel 13 and the heat insulating board 1112 cannot enter the waterproof ring 125, and may flow down along the outer side face of the waterproof ring 125, so as to further ensure waterproofness.

The plug-in panel 13 is arranged on outer side of the opening in the heat insulating board 1112 through screws, signal and power plugs are arranged in the plug-in panel 13, when the plug-in panel is installed on the heat insulating board 1112, the signal and power plugs are just inserted into the signal and power interfaces 124 of the display assembly 12; and meanwhile, a signal and power collinear cable 132 is led out of the other ends of the signal and power plugs from the plug-in panel 13, and a signal and power collinear plug 1321 is arranged at extending-out end of the signal and power collinear cable 132, so as to be conveniently and directly inserted into a signal and power collinear plug interface in the power control box 4. Meanwhile, a sealing ring is arranged at holes, allowing the signal and power collinear cable 132 to extend out, in the plug-in panel 13, so as to further ensure waterproofness. Moreover, a sealing sleeve is arranged on the plug of the signal and power collinear cable 132, rotationally connected with the plugs, and provided with internal threads, and external threads are arranged on the signal and power collinear plug interface in the power control box 4, thereby ensuring compactness and waterproofness in connection between the plug and the plug interface through threaded connection. In addition, a handle 133 is further arranged on the plug-in panel, so as to facilitate disassembling and assembling operations of installation and maintenance staff.

In addition, each of four side ends of each LED display panel 1 is provided with a slope structure 101 with a front face wider than a rear face, and a small section of assembling plane 102 is arranged at one end, close to the front side, of each slope structure 101, that is, the slope structure 101 and the assembling plane 102 are arranged at outer side ends of the sealing parts 112 and the wo end boards 1113 of each aluminum profile plate body 111. By means of the design, a contact area between the adjacent LED display panels is greatly reduced, thereby greatly reducing influences of flatness of assembling surfaces between the adjacent LED display panels on flatness of a surface of the whole display screen, that is, lowering production requirements on the LED display panels and reducing a defective rate of the product. The flatness of the surface of the display screen is ensured by standard parts with higher strength and small needed quantity during assembling of the LED display panels. In addition, by means of the design, gaps between the adjacent LED display panels are increased, so as to better facilitate cooling, and the cooling gaps are essential especially at positions between the transversely-assembled LED display panels as the flow guide cooling holes 1123 are formed in transverse assembling ends.

The descriptions mentioned above are specific structure of the LED display panel 1, the whole display screen further includes longitudinal assembling assemblies for longitudinally assembling the plurality of LED display panels 1, transverse assembling assemblies for transversely assembling the LED display panels 1, installation assemblies for installing and fixing the whole display screen, and the power control boxes 4 besides the LED display panels 1 as the minimum assembling units. As the LED display panels 1 may be generally designed into a cuboid structure with transverse portion wider than vertical portion, the quantity of the LED display panels assembled in a longitudinal direction may be large, so that a whole assembling concept of the present disclosure is as follows: firstly the plurality of LED display panels arranged longitudinally are assembled to form a LED display panel group, and then the two or more groups of LED display panels are transversely assembled, thereby simplifying assembling structures and improving assembling efficiency. In addition, by means of ingenious design of the present disclosure, the above transverse assembling assemblies and the above installation assemblies are combined into assembling and installation assemblies, that is, two groups of LED display panels are transversely assembled and the whole display screen is installed and fixed at the same time through one set of assemblies.

Figure 8:
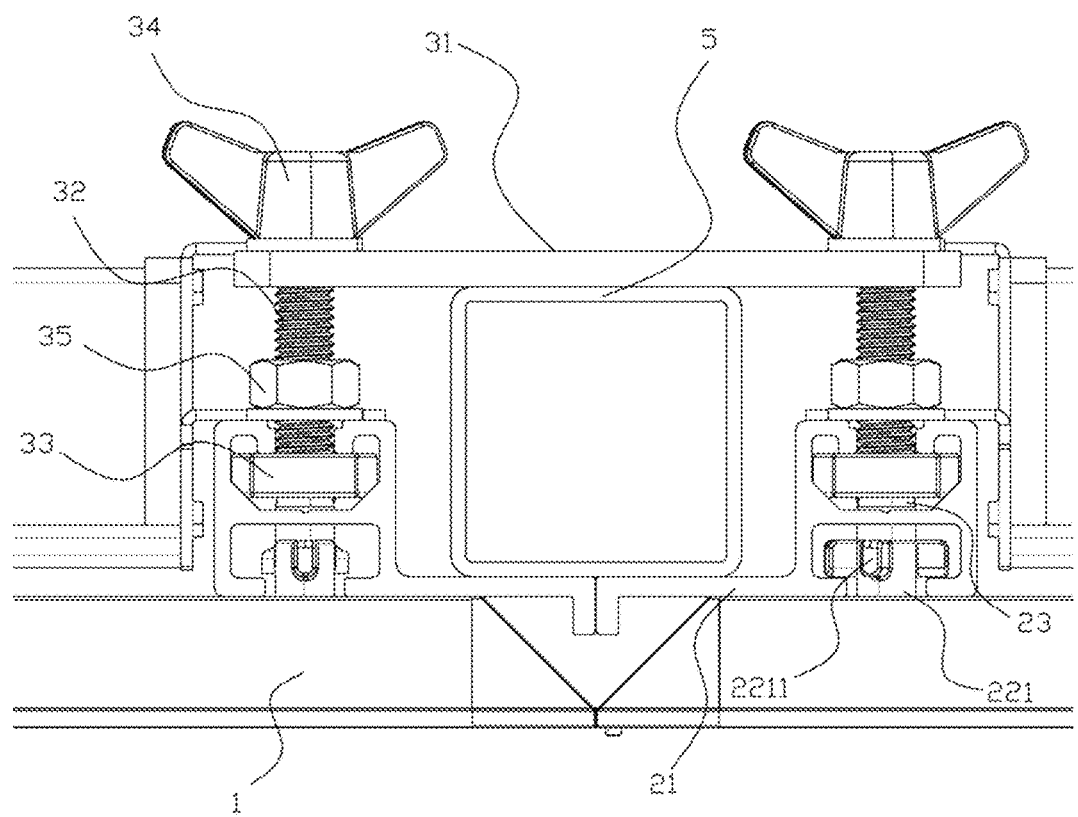
FIG. 8 is a structural schematic diagram of a transverse assembling position of the LED display panels according to the present disclosure.

As shown in FIG. 8, the longitudinal assembling assembly include a longitudinal reference part 21, and locks and positioning columns 23 which are arranged on the LED display panel 1. Wherein, the longitudinal reference part 21 is integrally-formed profile, and meanwhile has high structural strength and flatness. And the plurality of LED display panels 1 are sequentially tightly attached to planes of the longitudinal reference parts 21, so as to ensure the flatness of the surfaces of the longitudinally-assembled LED display panels. Moreover, the longitudinal reference parts 21 are arranged at positions, close to left and right sides, of backs of the LED display panels 1, that is, one group of LED display panels are longitudinally assembled through the left longitudinal reference part 21 and the right longitudinal reference part 21. Meanwhile, the longitudinal reference parts are arranged at the left and right ends of the LED display panels 1 to be not only used for the longitudinal assembling assemblies, but also used for the assembling and installation assemblies, thereby reducing the quantity of components, simplifying the installation process, and meanwhile, reducing the cost.

Figure 9:
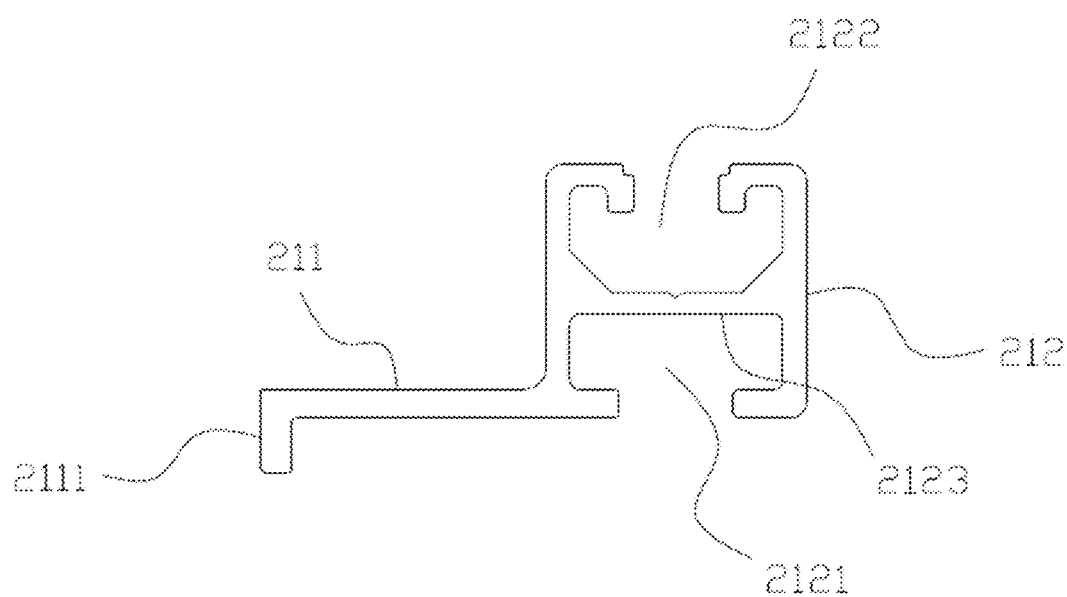
FIG. 9 is a structural schematic diagram of a longitudinal reference part according to the present disclosure.

As shown in FIG. 9, each longitudinal reference part 21 specifically includes an assembling portion 211 and a connecting portion 212. The assembling portion 211 is mainly a plane board horizontally attached to the back of the LED display panel 1, and meanwhile, one part of the assembling portion extends out of the LED display panel; and as the slope structures 101 are arranged at the side ends of the LED display panels 1, only the small sections of assembling planes 102 on the front sides abut against each other between the transversely-adjacent LED display panels 1, and the assembling portions 211 play a role in abutting between the transversely-adjacent LED display panels on the rear sides, so that abutting between the transversely-assembled LED display panels on the front sides and the rear sides is ensured, that is, the flatness of assembling is ensured. Moreover, in order to achieve a more stable abutting relationship between the assembling portions 211 of the two longitudinal reference parts 21, an end of each assembling portion 211 is provided with a section of abutting strip 2111 vertically bent inwards to be used for increasing an abutting area; and meanwhile, spaces are also provided for the abutting strips 2111 by the slope structures 101 at the side ends of the LED display panels 1, so as to prevent the abutting strips 2111 from being bent outwards, thereby ensuring the flatness of sides, back facing the LED display panels, of the assembling portions 211, so as to conveniently cooperate with the installation column (such as a square steel 5) for installation and fixation.

Each connecting portion 212 mainly includes a lock groove 2121 and a tensioning groove 2122 which are back to back formed and vertically run through, both of them share one groove bottom board 2123, and meanwhile, both of them are provided with limiting structures with an opening narrower than its inner chamber. Wherein, the lock groove 2121 faces the LED display panel 1, and is used for fitting in with the lock and the positioning column 23 to install and connect the LED display panel and the longitudinal reference part 21. Specifically, each of the left and right ends of the back of each LED display panel is provided with one positioning column 23 and two locks, wherein the positioning column 23 is located in middle, and the two locks are arranged on two sides of the positioning column 23 respectively. Correspondingly, a positioning hole fitting in with the positioning column 23 is formed in the groove bottom board 2123, and the distance between the adjacent positioning holes is equal to the longitudinal width of the LED display panel 1, so as to ensure installation precision, and meanwhile, improve installation efficiency.

Figure 10:
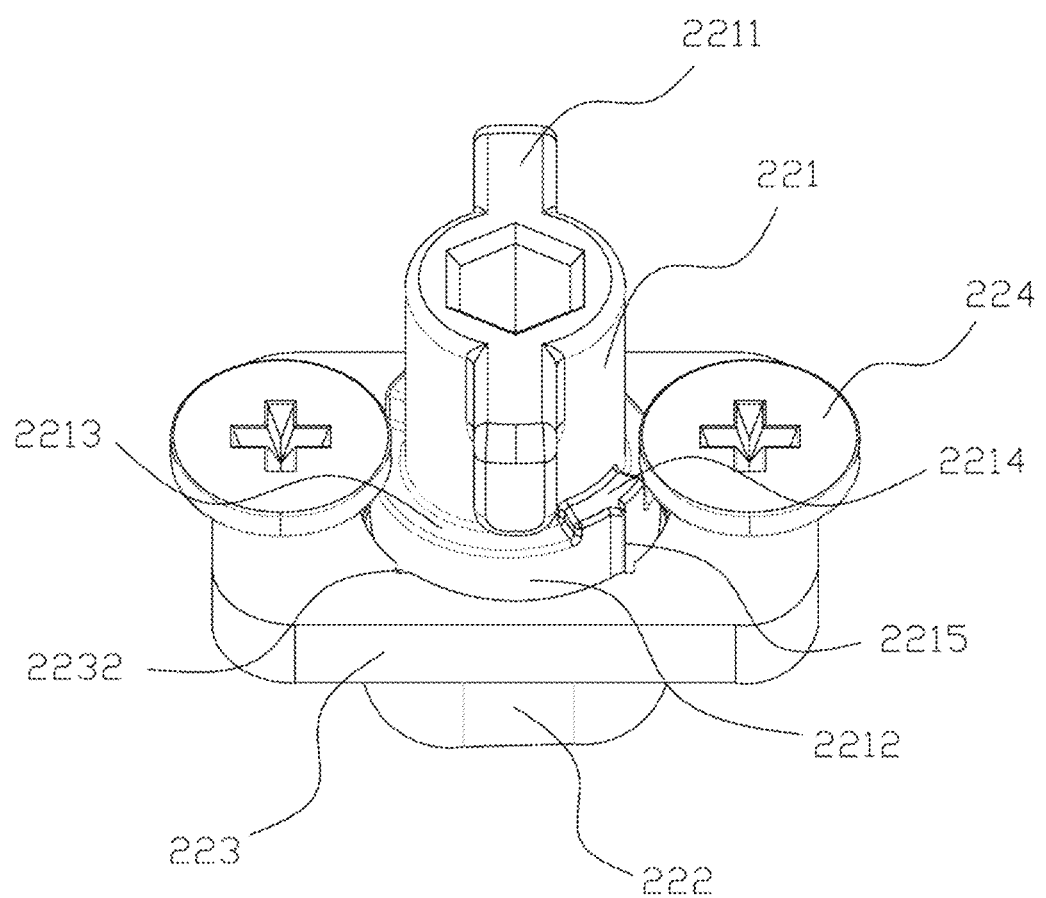
FIG. 10 is a structural schematic diagram of a lock according to the present disclosure.
Figure 11:
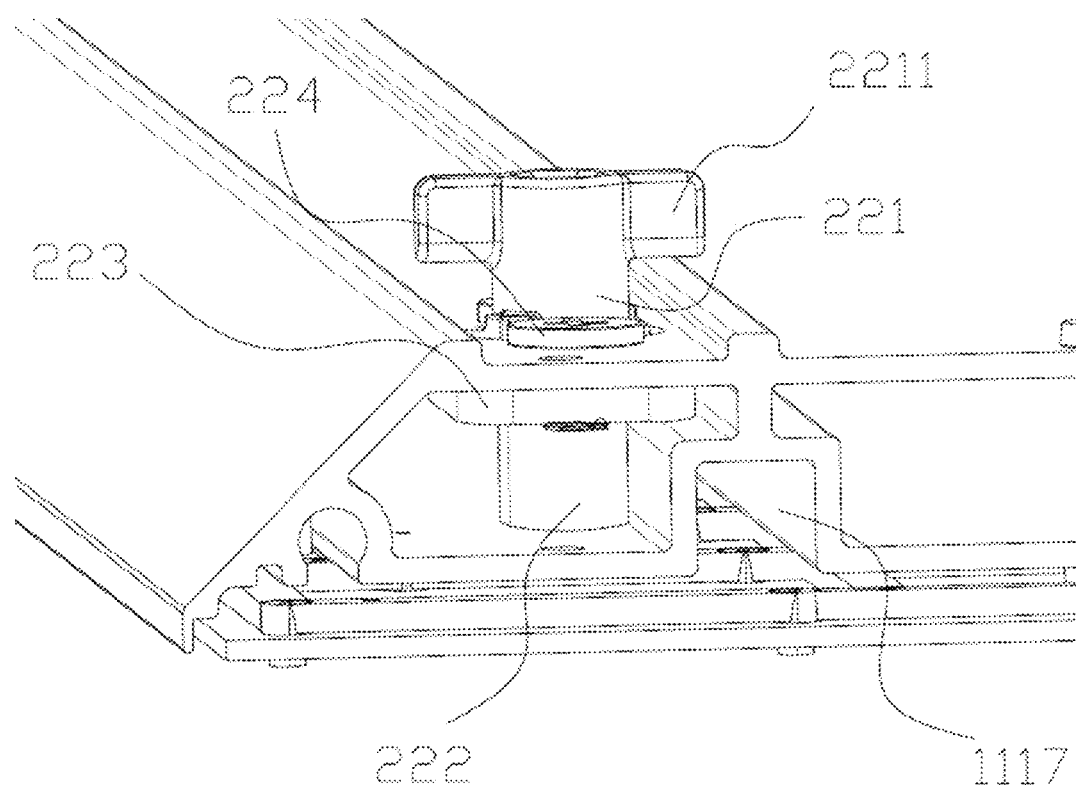
FIG. 11 is a structural schematic diagram of a lock at an opening in a side end of an aluminum profile plate body according to the present disclosure.

As shown in FIG. 10 and FIG. 11, each lock includes a lock cylinder 221, a lock cylinder sleeve 222, a fixing block 223 and pushing-abutting screws 224. Holes are formed in the installation board 1111 and the heat insulating board 1112, and the lock cylinder 221 is inserted into the hole in the heat insulating board 1112 till an end is just inserted into the hole in the installation board 1111. Each of back to back sides of one end of the lock cylinder 221 is provided with a lock block 2211, and a distance between back to back ends of the two lock blocks 2211 is larger than a width of an opening of the lock groove 2121. That is, when the lock cylinder 221 rotates to a state that the two lock blocks 2211 are located in a width direction of the lock groove 2121, the two lock blocks 2211 are limited in the lock groove 2121; when the lock cylinder rotates to a state that the two lock blocks 2211 are located in a length direction of the lock groove 2121, the lock blocks 2211 and the lock cylinder 221 may retreat from the lock groove.

An annular locking table 2212 is arranged on a middle side face of the lock cylinder 221, two identical locking slopes 2213 are arranged on a side, facing the lock blocks 2211, of the locking table 2212. A low position of one locking slope is connected with a high position of the other locking slope, and two connection positions are both provided with limiting tables 2214. Correspondingly, the two pushing-abutting screws 224 are fastened on an outer side face of the heat insulating board through the fixing block 223 located on an inner side face of the heat insulating board 1112, and located on back to back sides of the lock cylinder 221 respectively, and meanwhile, screw heads of the two pushing-abutting screws 224 need to partially extend out of an edge of the hole formed in the heat insulating board 1112, so as to fit in with the locking slopes 2213. Of course, the fixing block 223 is also provided with a through hole allowing the lock cylinder 221 to penetrate; and one end of the fixing block 223 is just clamped between outer bottom faces of the avoiding grooves 1117 and the inner side face of the heat insulating board 1112, thereby achieving auxiliary supporting on the fixing block before the pushing-abutting screws are tightened. When rotating, the lock cylinder 221 may gradually move towards a front side of the LED display panel due to the pushing-abutting effect of the locking slopes 2213 and the pushing-abutting screws 224, so that the two lock blocks 2211 gradually press a portion, with the opening, of the lock groove 2121, and the LED display panel 1 and the longitudinal reference parts 21 are locked and connected. Moreover, in-place prompt protrusions 2215 are arranged on side faces of the two limiting tables 2214, in-place prompt grooves 2232 are formed in an inner side wall of the through hole of the fixing block 223. And on one hand, the in-place prompt protrusions and the in-place prompt grooves are used for positioning a locking position of the lock cylinder, so as to avoid looseness; and on the other hand, an operator can grasp an in-place condition of rotation of the lock cylinder by sensing vibration or sound generated when the in-place prompt protrusions 2215 are clamped into the in-place prompt grooves 2232 under a condition that the operator cannot see the interior of the lock.

A portion, located in the LED display panel 1, of the lock cylinder 221 is sleeved with the lock cylinder sleeve 222, that is, the lock cylinder sleeve 222 is located between one end, back facing to the locking slope 2213, of the locking table 2212 and the inner side face of the installation board 1111, so as to limit a distance for which the lock cylinder 221 moves towards the front side of the LED display panel 1. Moreover, two back to back side faces of the lock cylinder sleeve 222 are planes, after installation, one plane is just attached to the outer walls of the avoiding grooves 1117, that is, rotation of the lock cylinder sleeve 222 itself is limited, and the stability of a position of the lock cylinder sleeve is also ensured. Finally, internal hexagonal holes are formed in front and rear ends of the lock cylinder 221 and used for front maintenance and rear maintenance respectively, and correspondingly, the PCB board 121 and the groove bottom board 2123 are both provided with operating holes allowing an internal hexagonal wrench to extend in.

As shown in FIG. 8, each assembling and installation assembly includes a transverse reference part 31 and a tensioning part, the tensioning part includes studs 32, tensioning blocks 33, tensioning nuts 34 and positioning nuts 35; and generally, the display screen can be installed on the vertically-fixed the installation column (such as a square steel 5), so the square steel serves as a reference part due to its properties of high structural strength and good surface flatness, and mainly the transverse reference part 31 and the assembling portions 211 of the two longitudinal reference parts 21 are oppositely clasped on two back to back side faces of the square steel 5, so as to install and fix the display screen. Moreover, as the flatness of side faces of the square steel 5 is high, when the assembling portions 211 of the two longitudinal reference parts 21 are tightly attached to the side faces of the square steel 5 at the same time, it is ensured that the two assembling portions 211 are located on the same plane, that is, the two adjacent groups of LED display panels are located on the same plane, that is, the flatness of the surfaces of the transversely-assembled LED display panels is ensured. Wherein, the transverse reference part 31 may adopt a steel plate with higher strength and flat surfaces, which avoids deformation under the action of clasping pressure between it and the square steel 5; and the assembling portion 211 of the longitudinal reference part 21 has a portion directly attached to back side of the LED display panel 1, so that clasping pressure between the square steel 5 and the assembling portion may be converted onto the LED display panel without causing deformation of the assembling portion 211.

It should also be noted that the transverse reference part 31 and the two longitudinal reference parts 21 are only clasped on the front and rear side faces of the square steel 5, and a distance between the connecting portions 212 of the two longitudinal reference parts 21 is larger than a width of the square steel 5 in a left-and-right direction, so as to reserve an adjusting space. As when there are three or more groups of transversely-assembled LED display panels, two or more pieces of square steel are needed, a distance between the pieces of square steel may have a certain error during installation, and if the above adjusting space is not reserved, the display screen cannot be successfully installed under a condition that the distance between the pieces of square steel has the error. Meanwhile, the levelness of the display screen is ensured by horizontal ground or a lower horizontal supporting structure, that is, a situation that the display screen tilts will not be caused by the above adjusting space.

Specifically, one tensioning block 33 may be fixed to one end of the corresponding stud 32 in advance in manners such as forming a screw hole, and slides in from an opening in a side end of the corresponding tensioning groove 2122; and meanwhile, the stud 32 connected with the tensioning block 33 slide along a notch of the tensioning groove 2122 till reaching needed installation position. Then, the positioning nut 35 is screwed to the stud 32 till being fastened at the notches of the tensioning groove 2122, so as to fix the tensioning block 33; and moreover, the tensioning block 33 has a width matched with a width of the tensioning groove 2122, that is, the tensioning block cannot autorotate in the tensioning groove 2122, and the positioning nut 35 may be smoothly tightened. In order to improve fastening stability, a gasket is arranged between the positioning nut 35 and the longitudinal reference part 21. When the studs 32 are installed and fixed on the two butted longitudinal reference parts 21, and abut against the square steel 5, the transverse reference part 31 sleeves the two studs 32 at the same time through the holes formed therein. Finally, the tensioning nuts 34 are screwed to the studs 32 till being fastened on the surface of the transverse reference part 31; and similarly, a gasket is also arranged between the tensioning nut 34 and the transverse reference part 31. Moreover, as force borne at the tensioning grooves 2122 is larger than that borne at the lock grooves 2121, in order to ensure structural strength of the tensioning grooves 2122, each of two sides of the notches of the tensioning grooves 2122 is provided with a section of structure vertically bent inwards, so as to increase thicknesses of the tensioning grooves 2122 in a force bearing direction. The tensioning nut 34 specifically may adopt a butterfly nut, so as to be conveniently fastened by the installation and maintenance staff directly by hands. The use quantity of the assembling and installation assemblies needs to be adjusted according to a height of the display screen, so as to ensure installation stability.

Thus, all the LED display panels 1 are locked with the longitudinal reference parts 21, and the longitudinal reference parts 21 and the transverse reference pars 31 are clasped on the square steel 5, so that all the LED display panels 1 are supported by the square steels 5 with reliable strength, thereby ensuring stability of the whole display screen.

It should be noted that as the tensioning block 33 can slide along the tensioning groove 2122 at will, the installation position of the whole assembling and installation assembly on the longitudinal reference part 21 may be freely selected according to actual conditions as long as the tensioning block does not interfere with other components, thereby improving flexibility and adaptability during installation.

It should also be noted that as the lock groove 2121 and the tensioning groove 2122 are back to back formed, force of the tensioning block 33 for the tensioning groove 2122 and force of the lock block 2211 for the lock groove 2121 reversely act on the same straight line, so as to achieve more balanced force bearing of the longitudinal reference part 21, thereby avoiding deformation of the longitudinal reference part.

The whole display screen also needs to be provided with the power control boxes 4, and each group of longitudinally-assembled LED display panels share one power control box 4; and as each plug-in panel 13 is arranged on back of the LED display panel, one power control box 4 is arranged at adjacent positions of the two LED display panels in order to avoid all plug-in panels 13 of each group of LED display panels to make the plug-in panels 13 and the power control box 4 electrically connected more conveniently.

Figure 12:
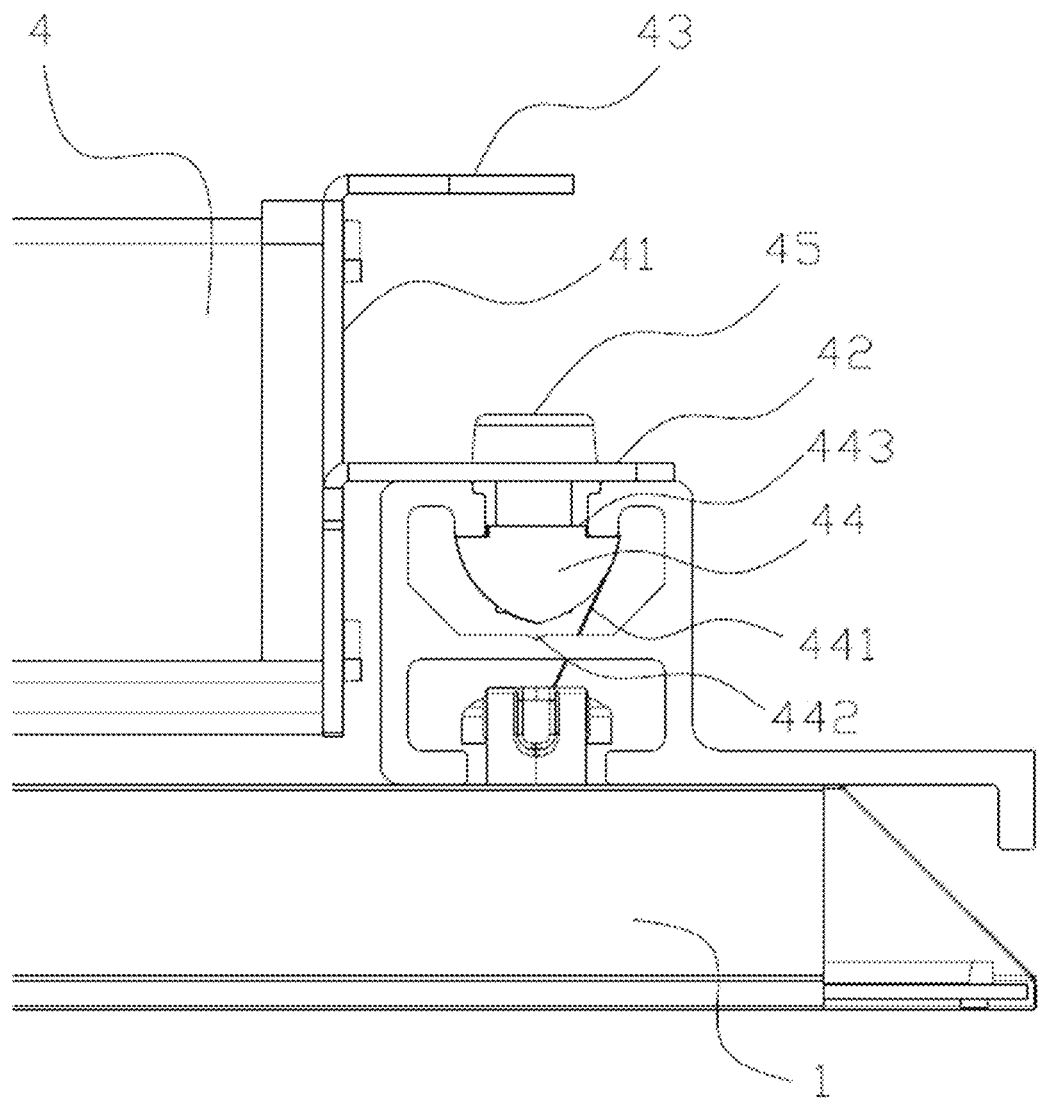
FIG. 12 is a structural schematic diagram of an installation position of a power control box according to the present disclosure.
Figure 13:
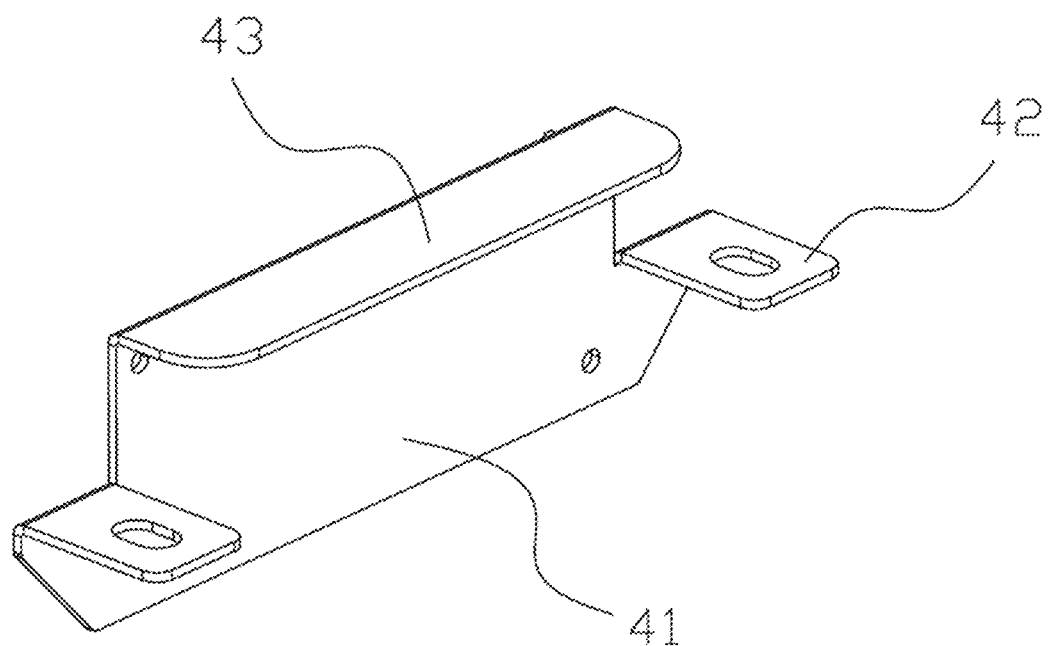
FIG. 13 is a structural schematic diagram of an installation part according to the present disclosure.

Specifically, as shown in FIG. 12 and FIG. 13, the power control box 4 is installed and fixed by the above longitudinal reference parts 21 similarly, that is, two ends of the power control box 4 are installed and connected with the longitudinal reference parts 21 at two ends of the LED display panels 1 respectively, so that the power control box 4 do not need to be directly tightly attached to the LED display panels 1, cooling gap is formed therebetween, and the LED display panels 1 are prevented from being affected by heat generated by the power control box 4. Wherein, integrally-formed installation parts are arranged at the two ends of the power control box 4. Each installation part includes a connecting board 41 fixed to a side end of the power control box 4 through screws, two fastening boards 42 arranged on two sides of the connecting board 41 respectively, and a handheld board 43 arranged at an upper end of the connecting board 41. The fastening board 42 is formed by cutting a longitudinal channel in the connecting board 41 and then bending by 90°, and the handheld board 43 is formed by directly bending by 90° at the upper end of the connecting board 41. A hole is formed in the fastening board 42, the fastening nut 44 is arranged in the tensioning groove 2122 of the longitudinal reference part 21, and fastening bolt 45 penetrates through the hole in the fastening board 42 to be in threaded connection with and fastened with the fastening nut 44, so as to install and fix the power control box 4.

Moreover, as the plug-in panel 13 is arranged on the back of the LED display panel, if the power control box 4 slides to the installation position along the back of the LED display panel, they may interfere with the plug-in panel 13, so they can only be directly attached to the correct position, that is, the fastening nut 44 cannot be connected with the fastening bolt 45 in advance, and it is needed to independently move the fastening nut 44 in the tensioning groove 2122 in place and then connect the fastening nut with the fastening bolt 45 penetrating through the fastening board 42. Thus, in order to ensure positional stability after the fastening nut 44 moves in the tensioning groove 2122 in place, a spring plate 441 is arranged on side face of the fastening nut; the spring plate 441 is bent towards bottom of the tensioning groove, and a position clamping groove 442 is further formed in the groove bottom board 2123 and used for making end of the spring plate 441 get clamped, so as to make the spring plate 441 kept in a tightened state all the time, so that the fastening nut 44 is pressed at the notch of the tensioning groove 2122 all the time to be prevented from sliding along the tensioning groove at will. Of course, we can manually adjust position of the fastening nut 44 according to actual conditions, so as to adjust the installation position of the power control box 4 on the longitudinal reference part 21, thereby ensuring flexibility and adaptability during installation. Moreover, in order to avoid auto-rotation of the fastening nut 44 during rotation of the fastening bolt 45, a boss 443 is arranged on the fastening nut 44 to be clamped into the notch of the tensioning groove 2122, so as to limit the fastening nut 44, and meanwhile, it is ensured that the boss 443 of the fastening nut 44 is clamped into the notch of the tensioning groove all the time by the above spring plate structure. In addition, the handheld board 43 is mainly used for providing effort exerting position when the installation and maintenance staff carry the power control box.

In the above descriptions of the structures of the LED display panel, signal and power collinear plug interfaces are formed in the power control boxes 4 and used for being connected with cables of the plug-in panels 13 on the LED display panels 1. Generally, one power control box 4 may be arranged in a middle of one group of LED display panels, and each of upper and lower sides of the power control box is provided with one signal and power collinear plug interface, so as to be conveniently connected with the cables of the LED display panels on upper and lower portions.

In conclusion, an installation principle of the display screen is as follows:

Firstly, as for a single LED display panel itself, the display assembly 12 is mainly installed and fixed onto the panel body 11 through screws, which is not repeated here. When one lock is installed, as the installation position of the lock is close to the side end of the panel, the fixing block 223 may be inserted from the opening in the side end of the aluminum profile plate body 111 before the sealing parts 112 are installed, one end of the fixing block is clamped between the outer bottom faces of the avoiding groove 1117 and the inner side face of the corresponding heat insulating board 1112, and the screw hole in the fixing block 223 is adjusted to align at the screw hole in the heat insulating board 1112. Then, the lock cylinder 221 sleeved with the lock cylinder sleeve 222 is inserted into the opening in the heat insulating board 1112, and penetrates through the through hole in the fixing block 223 till the end of the lock cylinder 221 is inserted into the hole in the installation board 1111. Then, the two pushing-abutting screws 224 penetrate through the screw holes in the heat insulating board 1112 to be connected with the fixing block 223 in a fastened manner. At this moment, one end of the lock cylinder 221 is limited by the lock cylinder sleeve 222, and the other end is limited by the two pushing-abutting screws 224, that is, the lock cylinder 221 has been stably assembled on the LED display panel. The four locks are sequentially installed, and the positioning columns 23 are directly connected with the threaded holes formed in the panel bodies through threads arranged at the ends of the positioning columns. Finally, the sealing parts 112 are inserted into the two ends of the aluminum profile plate body 111 and fixed through screws, and the plug-in panel 13 is installed at the opening in the back of the panel body through screws, so that one LED display panel is assembled. The above assembly process must be completed before delivery, rather than being reassembled on site.

Next, a plurality of LED display panels are longitudinally assembled. Firstly, the plurality of LED display panels are put with front faces located downwards, and sequentially laid on a horizontal plane in an aligned manner, and it is ensured that directions of the lock blocks 2211 on the lock cylinders 221 of each LED display panel are longitudinal assembling directions. Then, the positioning holes in the longitudinal reference parts 21 align at the positioning columns 23 on the backs of the LED display panels, so as to make the longitudinal reference parts 21 tightly attached to the backs of the LED display panels; and then the internal hexagonal wrench penetrates through the holes in the groove bottom boards 2123 in the longitudinal reference parts, and are inserted into the internal hexagonal holes in the ends of the lock cylinders 221, and the lock cylinders are rotated, so as to make the longitudinal reference parts 21 pressed on the LED display panels by the lock blocks 2211 of the lock cylinders. All the locks are sequentially locked, and each of the two ends of each LED display panel is provided with one longitudinal reference part 21. Finally, one power control box 4 is installed on the back of one group of LED display panels, and the cable on each plug-in panel 13 is connected with the power control box in a plug-in manner. Thus, one group of LED display panels is assembled. Generally, the above assembly process needs to be completed before delivery similarly, so as to be prevented from being affected by an environment of a display screen installation site, and meanwhile reduce installation procedures of the installation site as much as possible, thereby improving the installation efficiency of the site.

Finally, the plurality of LED display panels are transversely assembled on the display screen installation site, and meanwhile, installed on the square steel 5 of display screen installation supports, which are sequentially installed from bottom to top. Firstly, the tensioning blocks 33 in a needed quantity slide into the tensioning grooves 2122 in the longitudinal reference parts 21 at transverse assembling positions along with the studs 32 till reaching the installation positions, and then the positioning nuts 35 are tightened on the studs 32, so as to fix the positions of the tensioning blocks 33 and the studs 32. After the needed studs are all installed and fixed, the handle 133 on the plug-in panel 13 is used for carrying the two groups of LED display panels needing to be assembled, and the longitudinal reference parts of the two groups abut against the front side face of the square steel 5 at the same time; and then the left and right studs 32 are sleeved with the transverse reference parts 31, and the tensioning nuts 34 are tightened on the studs 32. The transverse reference parts 31 are sequentially installed on each group of studs, and then the two groups of LED display panels are transversely assembled till all the groups of LED display panels are installed on the square steel 5, thereby completing installation of the whole display screen.

Specifications of the whole display screen may be customized according to actual requirements, and include but are not limited to a size of the whole display screen, a size of each group of LED display panels and even a size of each LED display panel.

The above descriptions are merely preferred specific implementations of the present disclosure, which are implementations based on the whole concept of the present disclosure and are not intended to limit the protection scope of the present disclosure. Any change or replacement which is easily made by any person skilled in the art within the technical scope disclosed in the present disclosure should fall within the protection scope of the present disclosure. Thus, the protection scope of the present disclosure should follow the protection scope of the claims.

What is claimed is:

1. A display screen based on LED display panels, comprising a plurality of the LED display panels, at least one installation columns, a plurality of longitudinal reference parts, a plurality of assembling and installation assemblies, and a plurality of power control boxes; several LED display panels arranged in longitudinal direction consist of one group of LED display panels; each group of LED display panels has been longitudinally assembled through longitudinal reference parts arranged at positions, close to two sides, of backs of a plurality of LED display panels; two transverse adjacent groups of LED display panels are arranged at two sides of one installation column which is vertically located;

each LED display panel includes a panel body, a display assembly arranged on the panel body, and a plug-in panel arranged on a back of the panel body; and a power control box is jointly arranged on backs of the same group of LED display panels; and each assembling and installation assembly includes a transverse reference part, and a tensioning part respectively connected with two ends of the transverse reference part and two adjacent longitudinal reference parts, and the transverse reference part and the two adjacent longitudinal reference parts are clasped on back to back sides of the installation columns.

2. The display screen based on the LED display panels according to claim 1, wherein each panel body comprises an installation board and a heat insulating board spaced from the installation board, and supporting ribs connected with the installation board and the heat insulating board, a heat insulating flow guide chamber is formed between the installation board and the heat insulating board, and flow guide cooling holes are formed in opposite side faces of the panel body.

3. The display screen based on the LED display panels according to claim 2, wherein each panel body further comprises two end boards, and sealing parts arranged at two ends of the panel body, wherein the two end boards, the installation board and the heat insulating board are integrally formed; and the flow guide cooling holes are formed in the sealing parts.

4. The display screen based on the LED display panels according to claim 2, wherein a limiting groove is formed in a surface of the installation board, and a fixing part is arranged in the limiting groove.

5. The display screen based on the LED display panels according to claim 1, wherein each of four side ends of each panel body is provided with a slope structure with a front face wider than a rear face, and an assembling plane is arranged at an end, close to the front side, of the slope structure.

6. The display screen based on the LED display panels according to claim 1, wherein each display assembly comprises a PCB board, and an IC control chip and an LED lamp arranged on two sides of the PCB board respectively, and the IC control chip is attached to surfaces of the panel body.

7. The display screen based on the LED display panels according to claim 1, wherein signal and power interfaces of the display assembly are formed in the panel body, a waterproof ring is arranged at positions, around the signal and power interfaces, in the panel body, and one end of each waterproof ring extends out of the back of the corresponding panel body, and makes contact with an inner side face of the corresponding plug-in panel.

8. The display screen based on the LED display panels according to claim 1, wherein a lock groove facing the panel body is formed in a position, in length direction of the longitudinal reference part, of the longitudinal reference part; and the lock groove has a structure with an opening narrower than its inner chamber; a lock is arranged on the panel body, two lock blocks are arranged on back to back sides of ends, extending into the lock groove, of a lock cylinder of the lock; a distance between back to back ends of the two lock blocks is larger than a width of the opening of each lock groove; and an operating hole communicated to the lock cylinder is formed in front side face of the LED display panel and the longitudinal reference part.

9. The display screen based on the LED display panels according to claim 8, wherein a locking table is arranged on a side face of the lock cylinder; a locking slope facing one side of each lock block is arranged on the corresponding locking table, and a pushing-abutting part fitting in with the locking slope is arranged on the panel body.

10. The display screen based on the LED display panels according to claim 9, wherein the pushing-abutting part adopts pushing-abutting screws arranged on outer side faces of the panel body, and a fixing block fixedly connected with the pushing-abutting screws is arranged on inner side face of the panel body.

* * * * *